United States Patent [19]

De Boeck

[11] Patent Number: 5,221,637
[45] Date of Patent: Jun. 22, 1993

[54] MESA RELEASE AND DEPOSITION (MRD) METHOD FOR STRESS RELIEF IN HETEROEPITAXIALLY GROWN GAAS ON SI

[75] Inventor: Johan T. M. De Boeck, Mechlin, Belgium

[73] Assignee: Interuniversitair Micro Elektronica Centrum vzw, Belgium

[21] Appl. No.: 708,250

[22] Filed: May 31, 1991

[51] Int. Cl.⁵ ............................................ H01L 21/20
[52] U.S. Cl. ................................... 437/132; 437/126; 437/974; 437/976
[58] Field of Search ............... 437/132, 126, 966, 974, 437/976; 148/DIG. 135; 156/631, 633

[56] References Cited

U.S. PATENT DOCUMENTS 4,846,931  7/1989  Gmitter et al. ................... 156/633
4,900,372  2/1990  Lee et al. ......................... 437/132

FOREIGN PATENT DOCUMENTS 340113  11/1989  European Pat. Off. ............. 437/132

OTHER PUBLICATIONS

J. DeBoeck, et al., "As Grown Stress Free GaAs on Si by Regrowth on Chemically Released GaAs on Si Mesas." Japanese Journal of Applied Physics, vol. 30, No. 3B, Mar. 1991, pp. L423-L424.

J. DeBoeck, et al., "Mesa release and deposition used for GaAs-on-Si MESFET fabrication". Electronics Letters vol. 27, No. 1, pp. 22-23, Jan. 3, 1991 (abstract only).

Primary Examiner—Brian E. Hearn
Assistant Examiner—Linda J. Fleck
Attorney, Agent, or Firm—Ostrolenk, Faber, Gerb & Soffen

[57] ABSTRACT

A mesa release and deposition (MRD) method realizes stress relief in GaAs layers on Si, useful in practical device applications. A thin AlAs layer is incorporated in the heteroepitaxial GaAs layer about 1μm from the GaAs/Si interface. Mesas are etched down to the AlAs release layer and subsequently underetched in a 5% HF-solution at room temperature. Photoresist clamps keep the mesas in their exact position during the underetch process which results in a self-aligned re-deposition on the substrate after resist removal. Spatially resolved photoluminescence on GaAs on Si mesas before and after the MRD process was used to demonstrate the stress relief. GaAs epitaxy layers are thereafter grown on the GaAs on Si mesas. Spatially resolved photoluminescence was used to assess the strain level in the regrown layer. In contrast to the expected shift and splitting of the valence band of biaxially strained GaAs/Si, it was found that the peak shift of the band-to-band optical transition of the heteroepitaxial GaAs/MRD/Si to the GaAs reference at 77K is only 4nm and no valence band splitting was observed for the regrown layer.

15 Claims, 6 Drawing Sheets

| Simple type | GaAs/GaAs | GaAs/Si large area | | GaAs/Si mesa 100 x 200μm² | | GaAs/Si MRD 100 x 200 μm² |
|---|---|---|---|---|---|---|
| Valence band | | $m_j=\pm 1/2$ | $m_j=\pm 3/2$ | $m_j=\pm 1/2$ | $m_j=\pm 3/2$ | not resolved |
| Transition energy (eV) (77K PL) | 1.503 | 1.477 | 1.490 | 1.474 | 1.489 | 1.498 |
| Strain (77) | | 0.21 ± 0.01% | | 0.21 ± 0.01% | | 0.05 ± 0.02% |

FIG.5

MESA RELEASE AND DEPOSITION (MRD) METHOD FOR STRESS RELIEF IN HETEROEPITAXIALLY GROWN GAAS ON SI

BACKGROUND OF THE INVENTION

The present invention relates to the reduction of the stress in heteroepitaxially grown GaAs on Si and more particularly to the method of mesa release and deposition (MRD) for the realization of the stress relief from the perspective of fabrication of devices. The invention further relates to gallium arsenide on silicon MESFETs manufactured by using the mesa release and deposition technique of the invention.

Heteroepitaxy of gallium arsenide on silicon (GaAs-on-Si) has received considerable attention due to the promising monolithic combination of devices in each of these materials. The presence and interaction of crystal defects and thermally induced stress have posed obstacles for reliable optoelectronic applications using GaAs-on-Si substrates.

Stress-free GaAs-on-Si seemed to be feasible only when using the so-called Epitaxial Lift-Off (ELO) method, wherein a homoepitaxially grown structure is removed from its GaAs substrate and deposited on a new host. Although the technique has great potential, the transportation to and alignment with existing circuitry on the new carrier of small geometry ELO structures is troublesome. Typically, Epitaxial Lift-Off is a process that involves attaching a released GaAs device layer, which has been homoepitaxially grown on a GaAs substrate, to a silicon carrier. The processing, i.e. forming of the electronic devices, on the GaAs device layer can be done either before or after the transplantation of the GaAs layer to a new host. The foregoing process, while providing a viable alternative, is disadvantageous in that it presents device alignment difficulties and a more complex fabrication process.

The present invention is directed to a novel mesa release and deposition technique that relieves the thermally induced stress in the heteroepitaxially grown GaAs-on-Si. The technique uses an aluminum arsenide (AlAs) layer to chemically release post-growth defined GaAs mesas from the GaAs-coated-Si substrate and thereafter to reattach the mesas in their original positions. This allows the insertion of low-stress GaAs-on-Si mesas with dimension of at least $1 \times 10^4$ $\mu$m self-aligned within Si circuits by an extremely simple process.

The present invention describes the GaAs mesas release and reattachment process and its application to i) stress relief by post-growth etching and MRD processing, ii) the feasibility of subjecting the mesa released and deposited device regions to further processing that results in MESFET fabrication and iii) the regrowth of GaAs on mesa released and deposited regions that results in as-grown stress free GaAs on Si.

SUMMARY OF THE INVENTION

Accordingly, it is an object of the present invention to provide heteroepitaxially grown GaAs-on-Si which is free from the interaction of crystal defects and thermally induced stress.

It is a further object of the present invention to provide a simple and reliable method for manufacturing stress-relieved GaAs-on-Si devices.

The foregoing and other objects of the invention are realized in accordance with a method wherein a heteroepitaxial GaAs device layer is grown on a Si substrate separated therefrom by an AlAs release layer. GaAs mesas are formed by etching the gallium arsenide to the AlAs release layer or beyond.

Photoresist clamp layers are formed on the GaAs mesas to keep the mesas from floating during a subsequent step during which the mesas are released from the underlying layer. Releasing of the mesas is carried out by underetching the AlAs stop or release layer from underneath the GaAs mesas.

The mesas are thereafter covered with a $Si_3N_4$ capping layer to protect the released mesa regions during subsequent processing steps.

Eventually, devices are formed over the GaAs device layer (the mesas) and over the Si substrate where the mesas are not located by conventional techniques. For example, by conventional MESFET processing techniques formation of AuGeNi source-drain ohmic contact, followed by a Ti/TiW/Au Schottky contact is carried out. In both cases, dielectric assisted liftoff using ultrasonic agitation can be performed.

Advantages of the mesa release and deposition technique of the present invention include reduced stress level in the epilayers, selfaligned placement of crack-free GaAs islands (mesas) within a Si circuit and excellent yield.

Other features and advantages of the present invention will become apparent from the following description of the invention which refers to the accompanying drawings.

BRIEF DESCRIPTION OF THE DRAWINGS

FIG. 5 is a table which gives the peak positions versus valence bands for various samples

DETAILED DESCRIPTION OF THE DRAWINGS

Figure 1A:
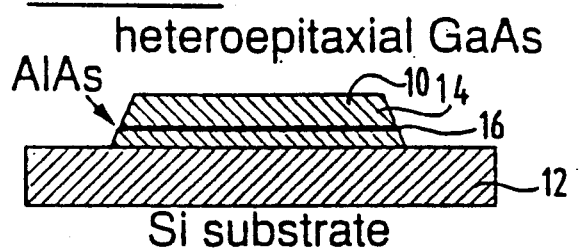
FIGS. 1(a)-1(e) show successive steps in the fabrication of a heteroepitaxially formed GaAs-on-Si device layer.

FIGS. 1(a)-1(e) schematically illustrate sequential steps in a mesa release and deposit process. Referring to FIG. 1(a), a GaAs device layer 10 is grown on a (100) 3° off Si substrate 12 by molecular beam epitaxy (MBE), separated from the underlying substrate 12 by layer 16 of AlAs.

Subsequent to the formation of the GaAs and AlAs layers, post growth patterning is carried out by which one or more discrete GaAs mesas 14 are formed from the GaAs device layer 10 by etching the device about 2.5 $\mu$m down to reach the AlAs etch release layer 16. Etching to the AlAs layer can be carried out using $1H_2SO_4:8H_2O_2:1000H_2O$ and $1NH_4OH:4OH_2O_2$ etchants sequentially.

The GaAs mesas 14 remain disposed over the Si substrate 12 separated by the release layer 16 of AlAs, as shown in FIG. 1(a).

Figure 1B:
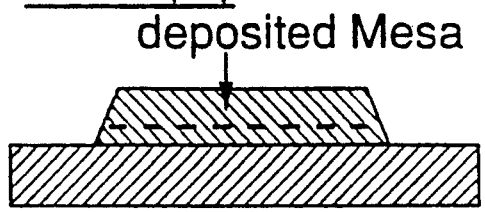

Photoresist "clamps" 18 are then deposited on the mesas 14 to keep the larger mesas from floating during subsequent releasing of the mesas 14, as shown in FIG. 1(b).

Figure 1C:
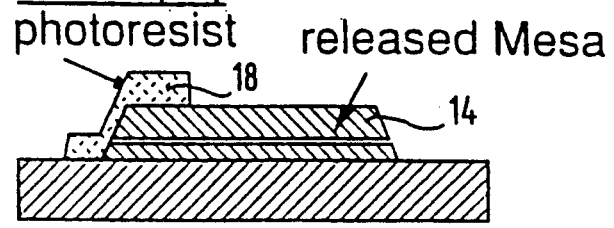

The 70 nm thick AlAs release layer 16 is then etched to completely effect a release of the mesas 14 from the underlying substrate 12. Preferably, the etching is carried out for four hours in a 5% hydrofluoric water solution ($HF:H_2O$) to complete the mesa release. The inventors herein have confirmed complete mesa release by monitoring by Nomarski contrast microscopy. Upon removal of the photoresist clamps 18, the mesas 14 are deposited selfaligned on their original positions, as shown in FIG. 1(c).

Thereafter, the mesas 14 may be covered with a 200 nm thick $Si_3N_4$ capping layer 20 to protect the released mesa regions 14 during subsequent processing steps.

Figure 4:
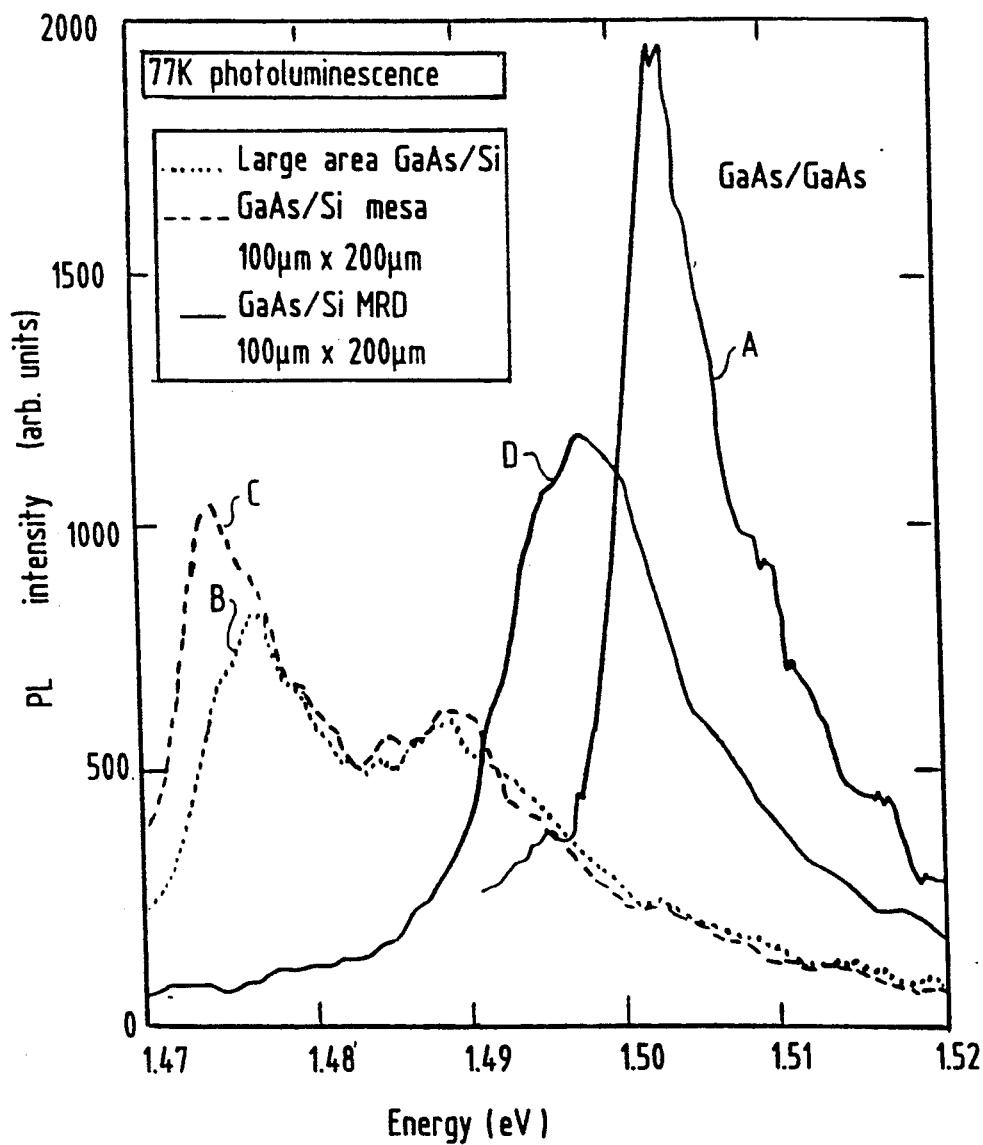
FIG. 4 is a graph showing photoluminescence spectra results.

In tests of the concepts of the present invention, photoluminescence was excited using modelocked pulses from a synchronously pumped dye laser at 680 nm. The laser spot diameter was varied from 5 to 20 $\mu$m in these spatially resolved PL experiments with an average power density on the sample of approximately 5 $Wcm^{-2}$. In FIG. 4, 77K PL spectra are shown for: a simultaneously grown GaAs/GaAs reference sample (data labeled "A"), an as-grown GaAs-on-Si (data labeled "B"), an as-grown GaAs-on-Si mesa (data labeled "C") (100×200 $\mu m^2$, dashed line) and an identical mesa after MRD processing (data labeled "D")(solid line). Excellent uniformity of the peak positions from one MRD region to another and also within a single mesa was noted. FIG. 5 gives the peak positions in eV for the optical transitions corresponding to the mj $-\pm\frac{1}{2}$ and $\pm 3/2$ valence bands (when resolved) and the strain derived from the optical transitions. When complete relaxation of the MRD GaAs layer and firm sticking to the substrate are assumed at room temperature, cooling to 77K results in a 0.07% thermally induced strain. This strain value corresonds to the measured value of 0.05 $\pm 0.02\%$ strain measured on the GaAs MRD region.

When the MRD technique is performed without the photoresist clamps 18 the mesas can be displaced and deposited on the substrate in a location that prevents firm sticking (partly covering another mesa e.g.). Photoluminescence spectra from such a GaAs mesa displays the exact unstressed GaAs transition at 1.503 eV (at 77K). Inherent to the MRD technique is that a new reference temperature for strain introduction is established at the point of adhesion as is the case in any artificially bonded two layer system as has been reported in the art for a thin GaAs film glued on a Si substrate and on quartz.

Figure 1D:
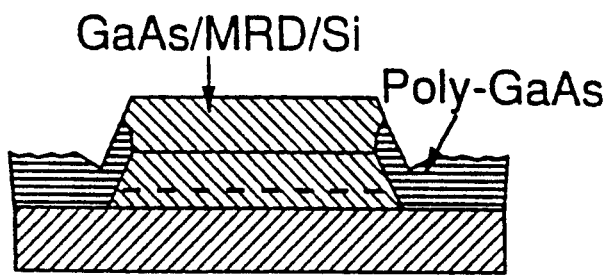

The foregoing MRD process may then proceed to the fabrication of devices, as by formation of as-grown stress-free GaAs on Si by regrowth on mesa released and deposited gallium arsenide on silicon (FIG. 1(d)). This regrowth step involves an epitaxy process during which the previously formed mesas 14 are subjected to temperature cycling, including a potentially stress inducing cool down phase However, as described below, the mesas 14 formed in accordance with the invention retained their stress-relieved characteristics even following the epitaxy process.

Figure 1E:
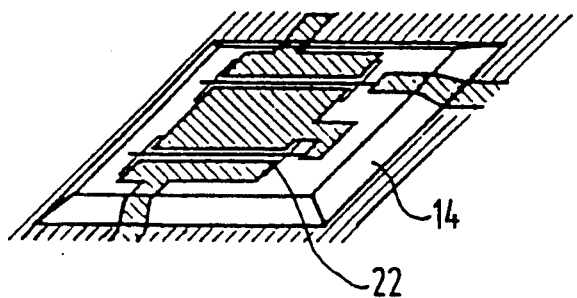

In an embodiment of the invention that has been reduced to practice, a MESFET active area was used to define the size and shape of the mesas 14. Preferably, part of a MESFET circuit 22 could be combined on a single mesa, as schematically shown in FIG. 1(e).

In the embodiment which has been reduced to practice, the epitaxial device structure consisted of a single 100 nm thick, $5\times 10^{17} cm^{-3}$ n-doped active layer. Standard MESFET processing was performed: formation of AuGeNi source-drain ohmic contact followed formation of a Ti/TiW/Au Schottky contact. In both cases, a dielectric assisted liftoff was performed during ultrasonic agitation.

Figure 2:
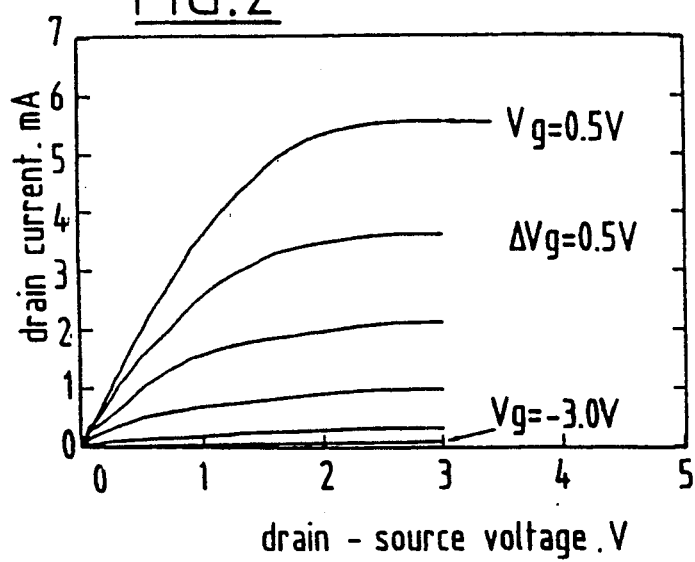
FIG. 2 is a plot of a MESFET device behavior constructed in accordance with the present invention.

Referring to FIG. 2, the device behavior of a 5 $\mu$m gate MESFET is shown. The characteristics of the device that had been reduced to practice are shown in FIG. 3 and were as follows: the source-gate spacing was 1.5 $\mu$m, the saturated drain current $1_{dss}=120$ mA/mm, the maximum extrinsic transconductance $g_m=85$ mS/mm at $V_g=-0.4$ V and the threshold voltage $V_t=-3$ V. The Schottky diode showed an ideality factor of 1.25, a barrier height $\phi_b=0.75$ V and a leakage current of 170 nA at $-2$ V. The high contact resistance of 0.8 $\Omega$/mm was due to the metal crossing the high mesa border. This step height decreases the processing yield, but can be reduced by planarization after the mesa release and deposit.

Figure 3A:
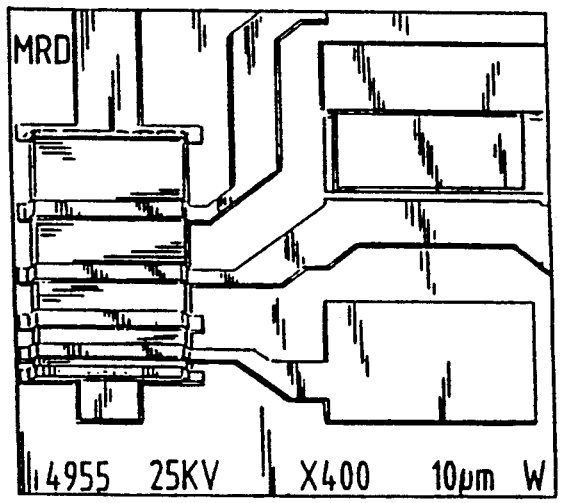
FIG. 3(a) shows a SEM micrograph of two mesa release and deposit regions after MESFET fabrication.
Figure 3B:
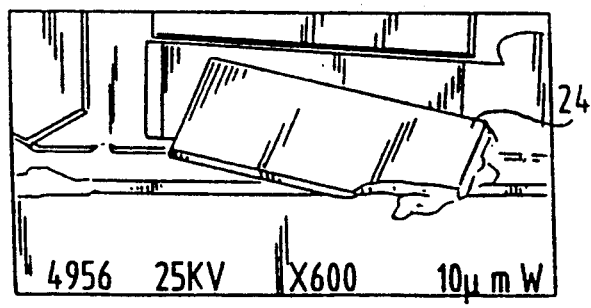
FIG. 3(b) shows a mesa that has been displaced at the edge of a sample upon cleaving.

Referring to FIG. 3(a), an SEM micrograph of two mesa release and deposit regions after MESFET fabrication demonstrates the feasibility of processing mesa release and deposit regions. All the mesa release and deposit islands remained in place without special precautions during ultrasonic liftoff and 420° C. contact alloy. When a sample was cleaved for inspection, one of the mesas from which the $Si_3N_4$ had been stripped for metallization, was displaced at the sample edge. This is shown in FIG. 3(b), illustrating the successful mesa release. That is, the mesas are completely underetched, the illustrated mesa was displaced at the sample edge upon cleaving, its nitride cap having been removed for metallization.

Important advantages of the mesa release and deposit technique of the present invention for GaAs-on-Si are reduced stress level in the epilayer, selfaligned placement of crack-free GaAs islands within the silicon circuit with single device dimensions of up to $1\times 10^4$ $\mu m^2$ and an excellent yield of the simple release-deposition action. Optimization of the geometry of the photoresist clamps 18 will lead to even larger crack-free mesa release and deposit areas. The technique of the present invention has the great advantage that the mesa's position is determined by standard lithography, in a self-aligned way. Since stress in the GaAs film is one of the most serious problems in the GaAs-on-Si monolithic integration, the proposed mesa release and deposition technique enhances the protection of GaAs-on-Si for device applications.

Preliminary tests indicate that mesa release and deposit regions can sustain $Si_3N_4$ capped rapid thermal annealing without blistering. The effects of thermal treatment on GaAs-on-Si mesa release and deposit vis-a-vis quality improvements are currently being investigated. Selective regrowth on mesa release and deposit islands could eventually reduce the number of dislocations generated during cool-down from growth temperature, even further enhancing their materials quality. The applications of the proposed technique to optical devices is straightforward, as these devices will greatly benefit from the lower stress with respect to performance and reliability.

In accordance with the present invention, standard processing steps, including ultrasonic liftoff and 420° C. contact alloy, can be performed without special precaution, as is demonstrated by MESFET fabrication that had been reduced to practice. The mesa release and deposit technique is believed to have considerable potential for improvements over the performance of monolithically integrated GaAs devices on Si.

In accordance with a variant of the invention, ±1 μm thick GaAs layers are grown heteroepitaxially on a 4° off (100) p-Si substrate by MBE. An 80 nm thick AlAs release layer, about 100 nm from the GaAs/Si interface, is provided. The GaAs-on-Si layer is mesa etched using $H_2SO_4:H_2O_2:H_2O$ to 500 nm above the AlAs layer. Subsequently, the GaAs is recessed down to the AlAs layer using $NH_4OH:H_2O_2$. The exposed AlAs is stripped in a 10% $HF:H_2O$ solution prior to spin a 3 μm thick photoresist layer. The resist is patterned to form clamps, leaving a large part of the mesa perimeter exposed for underetching, as previously described.

As before, the mesa release is performed in 5% $HF:H_2O$ solution. It was found that the mesa adhesion to the resist prevents cracking and floating, for dimensions up to 100×200 μm. The photoresist pattern seems to keep the mesa uplifted, helping the underetching procedure. Upon removal of the photoresist, the mesas are deposited self-aligned on their original positions. After this procedure, the GaAs mesas stick to the substrate and the samples could be rinsed and cleaned for nitride deposition to continue processing.

During the subsequent epitaxy process, selective epitaxy occurs on the MRD GaAs/Si with polycrystalline deposit on the surrounding Si. The epitaxial structure consists of a 1μm thick, undoped GaAs layer (FIG. 1d).

Figure 6:
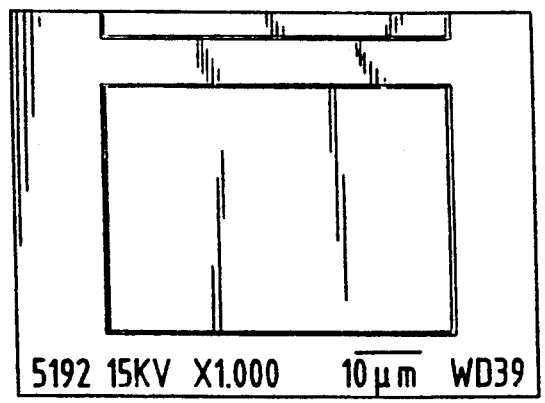
FIG. 6(a) and 6(b) are SEM micrographs of GaAs/MRD/Si areas.
Figure 6:
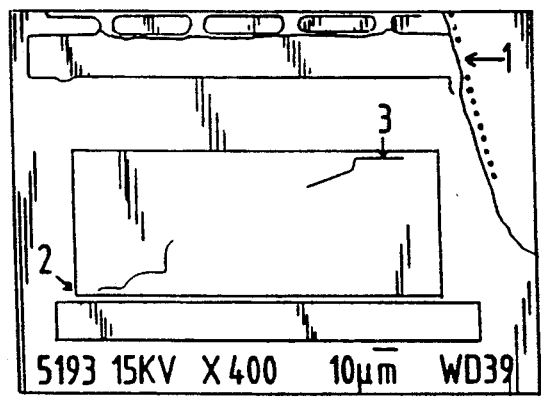

FIGS. 6(a) and 6(b) shows two top view SEM micrographs of GaAs/MRD/Si areas. In FIG. 6(a) an 80μm by 60μm GaAs/MRD/Si region after regrowth is shown. The monocystalline region has excellent morphology and is surrounded by fine-grain polycrystalline material. In FIG. 6(b) some remarkable features are indicated by the arrows. The features labeled 1 and 2 demonstrate that the mesas have been completely underetched. Arrow 1 points to the edge of the sample where a GaAs/MRD/Si stripe was removed during the mechanical cleavage (the dotted line indicates the sample edge). Arrow 2 indicates a stripe that was displaced a little during the MRD process. Arrow 3 points to a crack in the MRD layer, generated during the release action before growth. The problems of displacement and crack formation can be overcome by the use of photoresist clamps as described above, not used in this experiment.

Figure 7:
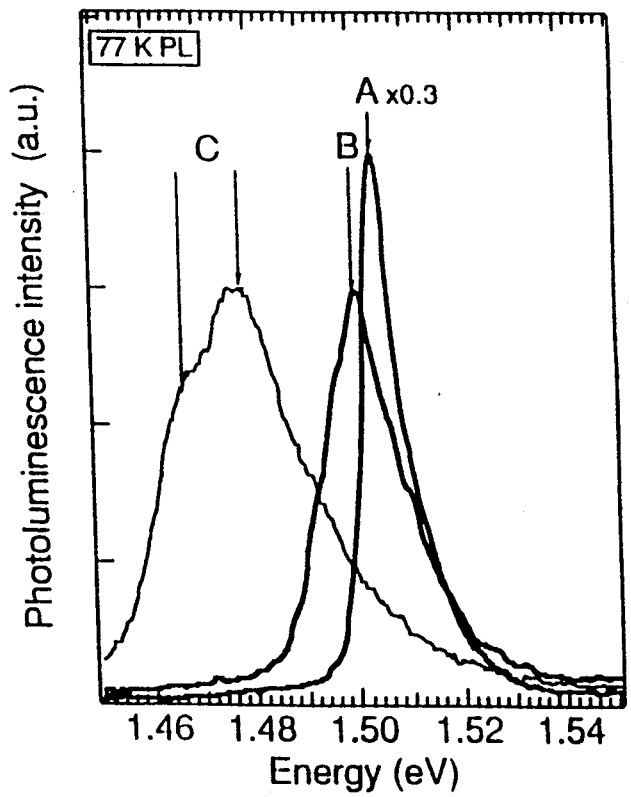
FIG. 7 is a graph of photoluminescence results for a GaAs/MRD/Si sample.

The results of spatially resolved photoluminescence (PL) on the GaAs/MRD/Si and a simultaneously grown GaAs reference sample at 77K are shown in FIG. 7. Neglecting the excitation binding energy at 77K, the data labeled A and B represent the band-to-band PL signal from the GaAs reference sample and the GaAs/MRD/Si, respectively. For comparison, a spectrum of a large area 3.5μm GaAs/Si MESFET layer is also given (labeled C, intensity normalized to B). In this GaAs/Si spectrum C the optical transitions involving the mj −±3/2 (1.478 eV) and mj −±½ (1.465 eV) valence bands in biaxially strained GaAs/Si are observed. The shift between the peak positions of the A and B spectra is only 4 meV demonstrating that almost complete stress free GaAs on Si is obtained. Residual strain possibly arises from contact between the poly- and monocrystalline regions over the island boundaries.

It is believed that the GaAs/MRD/Si layer is cooled down from the growth temperature without introducing stress, since there is no rigorous MRD/substrate interface. Based on the recent findings that the stress introduced during cool down is a major source for threading dislocations, regrowth on MRD/Si regions has great potential for improving the crystalline quality of heteroepitaxial GaAs on Si.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for constructing a composite GaAs-on-Si device, comprising:
   providing a Si substrate;
   providing an AlAs release layer over said Si substrate;
   epitaxially forming a layer of GaAs over said AlAs layer;
   etching said GaAs layer to form at least one GaAs mesa;
   underetching said AlAs from beneath said GaAs mesa to release said at least one mesa; and
   forming a circuit on said mesa.

2. The method of claim 1, wherein said GaAs layer is grown on a (100) 3% off Si substrate by molecular beam epitaxy.

3. The method of claim 1, wherein said at least one mesa is formed by etching said GaAs layer to said Si substrate layer.

4. The method of claim 3, wherein said GaAs is etched down to said AlAs release layer using $1H_2SO_4:8\text{-}H_2O_2:1000H_2O$ and $1 NH_4OH:4 H_2O_2$ etchants, sequentially.

5. The method of claim 4, wherein said GaAs layer is 1 to 4 μm thick.

6. The method of claim 5, wherein said AlAs layer is about 70 nm thick.

7. The method of claim 1, wherein said AlAs release layer is etched with an about 5% $HF:H_2O$ solution to effect release of said at least one mesa.

8. The method of claim 7, wherein said etching of said AlAs is conducted for about four hours.

9. The method of claim 1, further comprising depositing a photoresist at least partially over said at least one mesa to clamp it in place.

10. The method of claim 1, further comprising depositing a nitride capping layer over the released at least one mesa to keep it in place during subsequent processing.

11. The method of claim 10, wherein the nitrite capping layer comprises $Si_3N_4$.

12. The method of claim 10, further comprising stripping selected areas of said nitrite for metallization.

13. The method of claim 1, further comprising carrying out MESFET processing with ultrasonic liftoff and about 420° C. contact alloy.

14. The method of claim 1, wherein said at least one mesa is deposited selfaligned after it has been released from said AlAs layer.

15. The method of claim 9, further comprising forming a MESFET circuit over said at least one mesa.

* * * * *